US008314492B2

(12) United States Patent
Egawa

(10) Patent No.: US 8,314,492 B2
(45) Date of Patent: Nov. 20, 2012

(54) SEMICONDUCTOR PACKAGE AND PACKAGE-ON-PACKAGE SEMICONDUCTOR DEVICE

(75) Inventor: Yoshimi Egawa, Tokyo (JP)

(73) Assignee: Lapis Semiconductor Co., Ltd. (JP)

( * ) Notice: Subject to any disclaimer, the term of this patent is extended or adjusted under 35 U.S.C. 154(b) by 239 days.

(21) Appl. No.: 12/838,910

(22) Filed: Jul. 19, 2010

(65) Prior Publication Data

US 2011/0024904 A1 Feb. 3, 2011

(30) Foreign Application Priority Data

Jul. 30, 2009 (JP) ................................ 2009-177856

(51) Int. Cl.
*H01L 23/498* (2006.01)

(52) U.S. Cl. ........ 257/738; 257/737; 257/686; 257/777; 257/E23.069

(58) Field of Classification Search .......... 257/737–738, 257/686, 777, E23.069, E21.506, E21.507
See application file for complete search history.

(56) References Cited

U.S. PATENT DOCUMENTS 5,981,313 A * 11/1999 Tanaka .......................... 438/118
6,103,551 A * 8/2000 Ono et al. ...................... 438/108
6,425,516 B1 * 7/2002 Iwatsu et al. ............. 228/180.22
7,968,990 B2 * 6/2011 Tanaka et al. ................. 257/686
2007/0026568 A1 * 2/2007 Beyne ........................... 438/108
2007/0252285 A1 * 11/2007 Shiozawa et al. ............. 257/777
2008/0224312 A1 * 9/2008 Beyne ........................... 257/738
2009/0014874 A1 * 1/2009 Watanabe et al. ............. 257/737

FOREIGN PATENT DOCUMENTS

JP 2008-016729 A 1/2008

OTHER PUBLICATIONS

M. Uno; "Sanjigen jissou no Pop ni shin kouzou, teihaika to sekisoujiyuudo koujou wo jitsugen (a new structure of three-dimensional PoP which realizes to reduce package height and improve stacking flexibility)"; Nikkei Electronics; Jun. 16, 2008; pp. 12-13.

* cited by examiner

*Primary Examiner* — Thanh Nguyen
(74) *Attorney, Agent, or Firm* — Studebaker & Brackett PC; Donald R. Studebaker

(57) ABSTRACT

A semiconductor package includes a wiring board; a first electrode for external connection; a ball pad; a semiconductor chip; a mold resin; an electrode unit connected with the ball pad and penetrating the mold resin; and a second electrode for external connection connected with a portion of the electrode unit on a side of an outer surface of the mold resin. The electrode unit includes a first ball disposed on the ball pad; a second ball disposed between the first ball and the second electrode; and a solder material connecting between the ball pad and the first ball, between the first ball and the second ball, and between the second ball and the second electrode for external connection; each of the first ball and the second ball including a core part having a glass transition temperature which is higher than a melting point of the solder material.

7 Claims, 7 Drawing Sheets

118
119
130
115
115
122
123
121
114
111
111

118
119
130
115
115
120
122
123
121
114
112
111
111

118
115
115
120
119
122
123
121
114
112
111
111

111
112
113
111
122
123
121
119
115
115
120

101
118
119
120
115
122
123
121
114
113
111

SEMICONDUCTOR PACKAGE AND PACKAGE-ON-PACKAGE SEMICONDUCTOR DEVICE

BACKGROUND OF THE INVENTION

1. Field of the Invention

The present invention relates to a package-on-package (POP) semiconductor device, in which a semiconductor package is stacked on another semiconductor package and each of the semiconductor packages includes an internal semiconductor chip, a semiconductor package included in the POP semiconductor device, and methods of manufacturing them.

2. Description of the Related Art

There are various suggestions on POP semiconductor devices and semiconductor packages included in the POP semiconductor devices, for example, in Japanese Patent Kokai Publication No. 2008-16729 (Patent Document 1) and "Sanjigen jissou no PoP ni shin kouzou, teihaika to seki-soujiyuudo koujou wo jitsugen (a new structure of three-dimensional PoP which realizes to reduce package height and improve stacking flexibility)", Nikkei Electronics of Jun. 16, 2008, pp. 12-13 (Non-Patent Document 1).

Patent Document 1 (see FIG. 1 and claim 1, for example) describes a double-sided electrode structure which is a semiconductor package internally having a semiconductor chip. The double-sided electrode structure includes an organic substrate, on which the semiconductor chip is mounted, an electrode which is formed on a lower surface of the organic substrate, a sealing resin which covers the semiconductor chip, pillar-shaped electrodes for internal connection which are connected with a wiring on an upper surface of the organic substrate and penetrates the sealing resin, and a redistribution layer which is formed on an upper surface of the sealing resin.

Further, Patent Document 1 (see FIGS. 1 to 6 and claim 14, for example) describes a method of manufacturing the double-sided electrode structure. In this manufacturing method, the semiconductor chip is mounted on the upper surface of the organic substrate which has the electrodes for external connection on the lower surface thereof, each end of the plurality of pillar-shaped electrodes for internal connection which are united as a single unit by a uniting plate are connected with the upper surface of the organic substrate, the semiconductor chip is resin-sealed, then the uniting plate is removed by polishing or grinding, thereby the united plurality of electrodes for internal connection are divided into individual electrodes for internal connection and the divided electrodes are used as electrodes for external connection on an upper surface.

Non-Patent Document 1 (see FIG. 1, FIG. 3 and an explanation thereof, for example) describes a double-sided electrode package which is a semiconductor package internally having a semiconductor chip. The double-sided electrode package includes an interposer on which the semiconductor chip is mounted, a solder ball which is provided on a lower surface of the interposer, a sealing resin which covers the semiconductor chip, a pillar-shaped via which penetrates the sealing resin, and a redistribution layer which is formed on an upper surface of the sealing resin.

Non-Patent Document 1 (see FIG. 3 and an explanation thereof, for example) also describes a method of manufacturing the double-sided electrode package. In this manufacturing method, the semiconductor chip is mounted on the interposer, the pillar-shaped vias are formed on a supporting plate of stainless steel by electroplating, the vias which are supported on the supporting plate are connected on the interposer, the sealing resin is filled on the semiconductor chip, the supported vias are divided into a plurality of individual vias by removing the supporting plate, and upper ends of the individual vias are used as electrodes on an upper surface.

However, in the device of Patent Document 1, the electrodes for internal connection are the pillar-shaped electrodes which are united with the uniting plate, and a time-consuming process is required such that each of the terminals of the pillar-shaped electrodes are connected with a wiring pattern on the organic substrate and then the uniting plate is removed by polishing or grinding. Thus, the device has the following problems that: it is difficult to reduce manufacturing costs and manufacturing time (i.e., to reduce a turnaround time (TAT)), and consequently, it is difficult to lower a price of a product.

On the other hand, the device of Non-Patent Document 1 has the vias which are the pillar-shaped electrodes formed by electroplating on the supporting plate of stainless steel. Thus, the device has the following problems that: it is difficult to reduce manufacturing costs because photomasks are used in photolithography technology for forming a resistor pattern for the electroplating, it is also difficult to reduce manufacturing time (i.e., to reduce a TAT) because it takes a long time to form the vias by electroplating, and consequently, it is difficult to lower a price of a product.

SUMMARY OF THE INVENTION

It is an object of the present invention to provide a semiconductor package and a manufacturing method thereof that make it possible that another semiconductor package can be stacked on an upper surface of the semiconductor package, and manufacturing costs and time can be reduced, thereby lowering a price of a product. It is another object of the present invention to provide a package-on-package semiconductor device and a manufacturing method thereof, in which another semiconductor package can be stacked on an upper surface of the semiconductor package, and manufacturing costs and time can be reduced, thereby lowering a price of a product.

According to an aspect of the present invention, a semiconductor package includes: a wiring board including a wiring pattern and/or a through wiring; a first electrode for external connection disposed on a side of a first surface of the wiring board; a ball pad which is an electrode on a side of a second surface of the wiring board, the second surface being opposite to the first surface of the wiring board; a semiconductor chip mounted on the side of the second surface of the wiring board; a mold resin covering at least the semiconductor chip; an electrode unit being connected with the ball pad and penetrating the mold resin; and a second electrode for external connection being connected with a portion of the electrode unit on a side of an outer surface of the mold resin. The electrode unit includes: a first ball disposed on the ball pad; a second ball disposed between the first ball and the second electrode for external connection; and a solder material connecting between the ball pad and the first ball, between the first ball and the second ball, and between the second ball and the second electrode for external connection. Each of the first ball and the second ball includes a core part having a glass transition temperature which is higher than a melting point of the solder material.

According to another aspect of the present invention, a method of manufacturing the semiconductor package includes the steps of: forming a ball pad as an electrode and mounting a semiconductor chip, on a second surface of a wiring board including a wiring pattern and/or a through wiring; putting a solder material and a first ball on the ball pad and solder-bonding the first ball to the ball pad by heating; forming a second electrode for external connection on a supporting plate, putting a solder material and a second ball on the second electrode for external connection, and solder-bonding the second ball to the second electrode for external connection by heating; putting the supporting plate on the wiring board so that the second ball is put on the first ball and solder-bonding the first ball and the second ball by heating; sealing, with a mold resin, the semiconductor chip and an electrode unit including the first ball, the second ball and the solder material; and exposing the second electrode for external connection by removing the supporting plate. Each of the first ball and the second ball includes a core part having a glass transition temperature which is higher than a melting point of the solder material.

According to a further aspect of the present invention, a package-on-package semiconductor device includes: a first semiconductor package; and a second semiconductor package of the above-mentioned semiconductor package disposed on the first semiconductor package. The first semiconductor package includes: a wiring board including a wiring pattern and/or a through wiring; a first electrode for external connection disposed on a side of a first surface of the wiring board; a ball pad which is an electrode on a side of a second surface of the wiring board, the second surface being opposite to the first surface of the wiring board; a semiconductor chip mounted on the side of the second surface of the wiring board; a mold resin covering at least the semiconductor chip; an electrode unit being connected with the ball pad and penetrating the mold resin; and a second electrode for external connection being connected with a portion of the electrode unit on a side of an outer surface of the mold resin. The electrode unit of the first semiconductor package includes: a first ball disposed on the ball pad; a second ball disposed between the first ball and the second electrode for external connection; and a solder material connecting between the ball pad and the first ball, between the first ball and the second ball, and between the second ball and the second electrode for external connection. Each of the first ball and the second ball includes a core part having a glass transition temperature which is higher than a melting point of the solder material. The first electrode for external connection of the second semiconductor package is connected with the second electrode for external connection of the first semiconductor package.

According to a still further aspect of the present invention, a package-on-package semiconductor device includes: a first semiconductor package; and a second semiconductor package of the above-mentioned semiconductor package disposed on the first semiconductor package. The first semiconductor package includes: a wiring board including a wiring pattern and/or a through wiring; a first electrode for external connection disposed on a side of a first surface of the wiring board; a ball pad which is an electrode on a side of a second surface of the wiring board, the second surface being opposite to the first surface of the wiring board; a semiconductor chip mounted on the side of the second surface of the wiring board; a mold resin covering at least the semiconductor chip; an electrode unit being connected with the ball pad and penetrating the mold resin; and a second electrode for external connection being connected with a portion of the electrode unit on a side of an outer surface of the mold resin. The electrode unit of the first semiconductor package includes: a first ball disposed on the ball pad; a second ball disposed between the first ball and the second electrode for external connection; and a solder material connecting between the ball pad and the first ball, between the first ball and the second ball, and between the second ball and the second electrode for external connection. Each of the first ball and the second ball includes a core part having a glass transition temperature which is higher than a melting point of the solder material. The first semiconductor package further includes: a third electrode for external connection on the side of the outer surface of the mold resin; and a redistribution layer for connecting the second electrode for external connection and the third electrode for external connection. The first electrode for external connection of the second semiconductor package is connected with the third electrode for external connection of the first semiconductor package.

The present invention has advantageous effects to reduce manufacturing costs and manufacturing time and to lower a price of a product, in manufacturing of a semiconductor package capable of stacking another package on an upper surface thereof and a package-on-package semiconductor device in which the other package is stacked on an upper surface of the semiconductor package.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

First Embodiment

Figure 1:
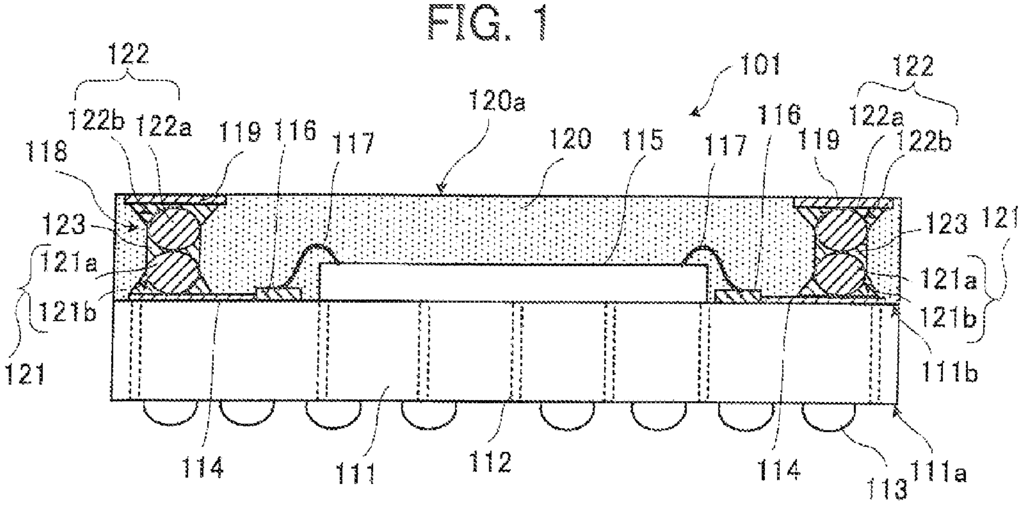
FIG. 1 is a longitudinal sectional view schematically illustrating a structure of a semiconductor package according to a first embodiment of the present invention.
Figure 2:
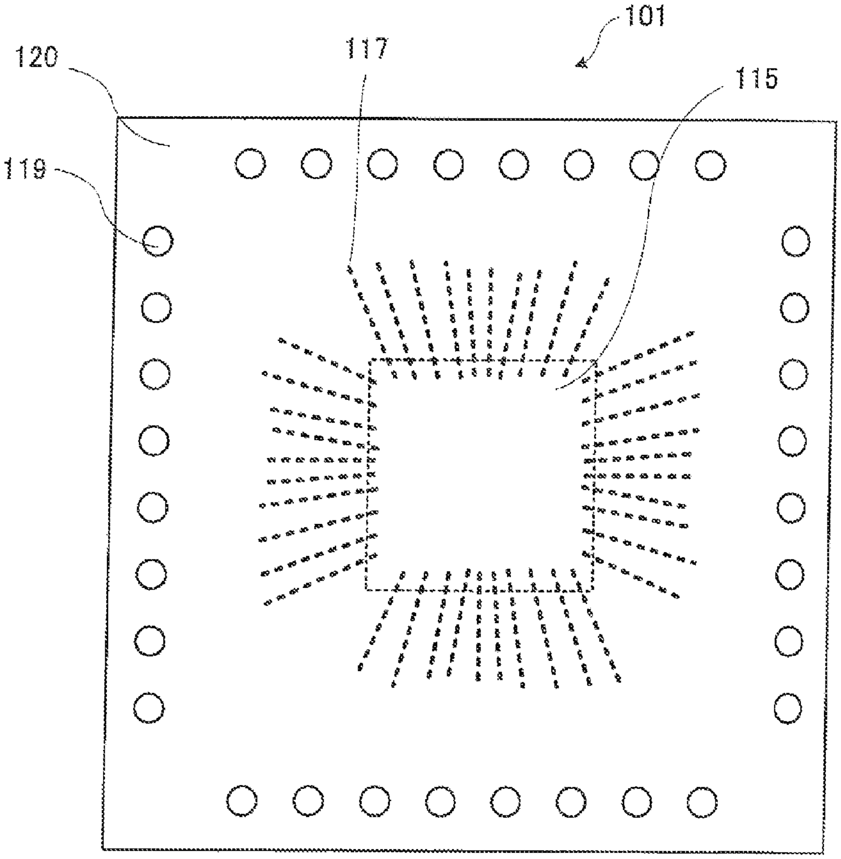
FIG. 2 is a plan view schematically illustrating a top view of the semiconductor package according to the first embodiment.

FIG. 1 is a longitudinal sectional view schematically illustrating a structure of a semiconductor package 101 according to a first embodiment of the present invention, and FIG. 2 is a plan view schematically illustrating a top view of the semiconductor package 101 according to the first embodiment. A package-on-package (POP) semiconductor device can be realized by stacking another package (not shown in the drawings) on the semiconductor package 101 according to the first embodiment.

As shown in FIG. 1 and/or FIG. 2, the semiconductor package 101 according to the first embodiment includes a wiring board (e.g., a glass epoxy substrate) 111 which has a wiring pattern (not shown in the drawings) formed by a printed wiring on a substrate and/or a through wiring 112 for electrically connecting both sides of the substrate by a through hole which penetrates the substrate, and a first electrode 113 for external connection (e.g., a solder terminal) which is disposed on a side of a first surface 111*a* of the glass epoxy substrate 111 (the lower side in FIG. 1). The semiconductor package 101 has a ball pad 114 which is disposed on a side of a second surface 111*b* which is an opposite side of the first surface 111*a* of the glass epoxy substrate 111 (the upper side in FIG. 1) and is an electrode connected with the wiring pattern (not shown in the drawings), a semiconductor chip 115 which is mounted on the side of the second surface 111*b* of the glass epoxy substrate 111, a bonding pad 116 which is an electrode connected with the wiring pattern (not shown in the drawings), and a gold wire 117 which is a bonding wire for electrically connecting the semiconductor chip 115 and the bonding pad 116. The ball pad 114 and the bonding pad 116 are made of Au—Al alloy, for example.

As shown in FIG. 1 and/or FIG. 2, the semiconductor package 101 has an electrode unit 118 which is connected with the ball pad 114, a second electrode 119 for external connection (POP pad) which is disposed on an upper surface of the electrode unit 118, and a mold resin 120 which covers the semiconductor chip 115 and the electrode unit 118. The POP pad 119 is exposed on a side of a surface 120*a* of the mold resin 120 (an upper surface in FIG. 1). The POP pad is made of Au—Al alloy, for example. The electrode unit 118 includes a first ball 121 which is disposed on the ball pad 114, a second ball 122 which is disposed between the first ball 121 and the POP pad 119, and the solder material 123 which connects between the ball pad 114 and the first ball 121, between the first ball 121 and the second ball 122, and between the second ball 122 and the POP pad 119.

The first ball 121 and the second ball 122 include core parts 121*a* and 122*a* having a glass transition temperature (TG) which is higher than a melting point of the solder material 123 (e.g., 250° C.), respectively. Although the first ball 121 and the second ball 122 may have only the core parts 121*a* and 122*a* (if the core part is conductive metal, for example), the balls may have surface parts 121*b* and 122*b* which cover outer circumferences of the core parts 121*a* and 122*a*, respectively. The core parts 121*a* and 122*a* of the first ball 121 and the second ball 122 are made of a material such as metal (e.g., Cu, Ni, Au, Fe and the like), synthetic resin, ceramics, or the like. The surface parts 121*b* and 122*b* which surround the core parts 121*a* and 122*a*, respectively, are conductive metal layers made of plating, for example. As material for the surface parts, SnAg, SnAgCu, SnAgBi or Au is available, for example. More specific examples of the first ball 121 and the second ball 122 are as follows: the core parts 121*a* and 122*a* are made of spherical-shaped Cu material and the surface parts 121*b* and 122*b* are made of SnAg plating, or, the core parts 121*a* and 122*a* are made of spherical-shaped resin and the surface parts 121*b* and 122*b* are made of SnAg plating.

FIGS. 3A to 3C, FIGS. 4A to 4C, and FIGS. 5A to 5E are diagrams schematically illustrating manufacturing steps in a method of manufacturing the semiconductor package 101 according to the first embodiment.

Figure 3A:
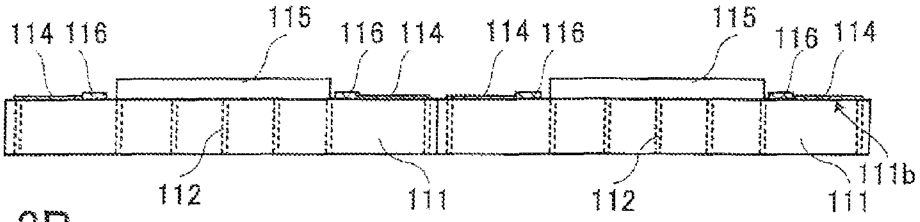
FIGS. 3A to 3C are diagrams schematically illustrating manufacturing steps in a method of manufacturing the semiconductor package according to the first embodiment.
Figure 3B:
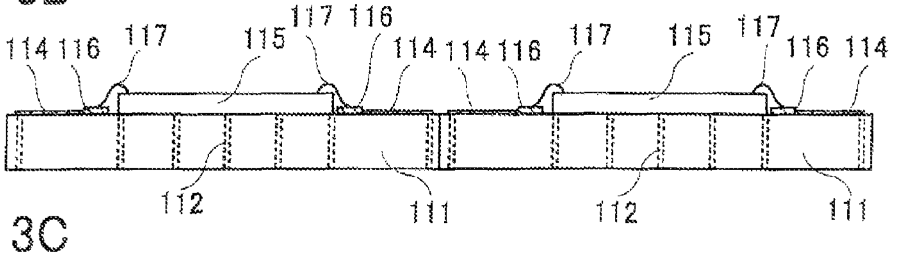
Figure 3C:
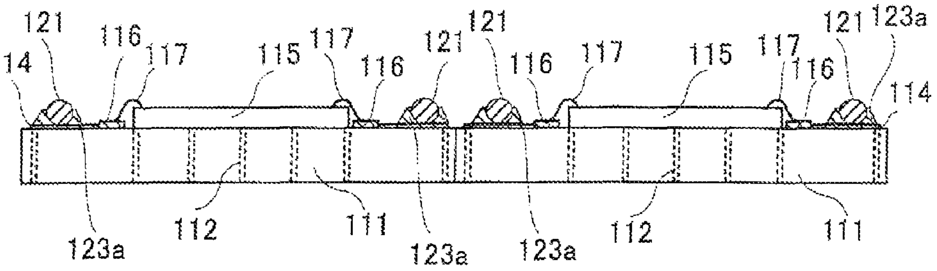

In manufacturing the semiconductor package 101, the ball pad 114 and a bonding pad 116 are formed in predetermined positions on the second surface 111*b* of the glass-epoxy substrate 111, a semiconductor chip 115 is mounted in a predetermined position with an adhesive agent (at die-bonding step) as shown in FIG. 3A, and then, the semiconductor chip 115 is connected with the bonding pad 116 by the gold wire 117 (at wire-bonding step) as shown in FIG. 3B. Next, as shown in FIG. 3C, a solder paste (or flux and solder paste) 123*a* is supplied on the ball pad 114, the first ball 121 is disposed thereon, the first ball 121 is soldered to the ball pad 114 by heating which is a step of reflow soldering for example, and cleaning is performed for removing the flux if necessary (at ball mounting/reflow step). This reflow soldering is performed at a temperature which equals to the melting point of the solder material 123 or more and is less than the glass transition temperature (TG) of the core parts of the first ball 121 and the second ball 122. For this reason, at the reflow step, there is little change in shapes of the first ball 121 and the second ball 122.

Figure 4A:
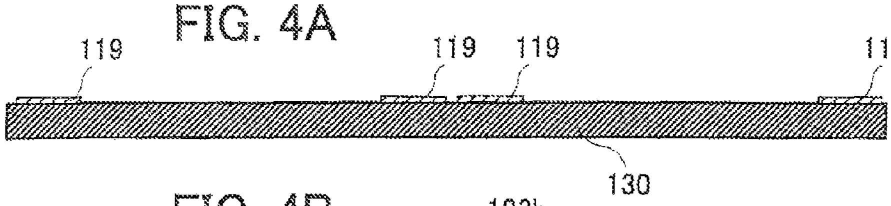
FIGS. 4A to 4C are diagrams schematically illustrating manufacturing steps in the method of manufacturing the semiconductor package according to the first embodiment.
Figure 4B:
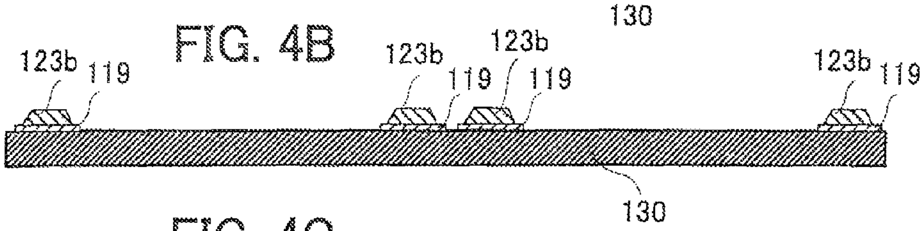
Figure 4C:
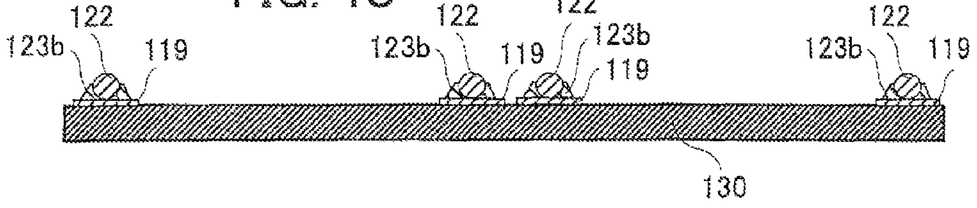

As shown in FIG. 4A, the POP pad 119 is formed in a predetermined position, directly on a stainless-steel (SUS) plate 130 which is a supporting plate, or on an easily-detachable layer (such as a resin layer, not shown in the drawings) which is disposed between the POP pad 119 and the plate 130 (for example, the POP pad 119 is made of plating, or the POP pad 119 is bonded by an adhesive agent) (at pad forming step). As shown in FIG. 4B, a solder paste (or flux and solder paste) 123*b* is supplied on the POP pad 119 (at solder printing step). Next, as shown in FIG. 4C, the second ball 122 is disposed on the solder paste 123*b*, the second ball 122 is soldered to the POP pad 119 by heating which is a step of reflow soldering for example, and cleaning is performed for removing flux if necessary (at ball mounting/reflow step). This reflow soldering is performed at a temperature which equals to the melting point of the solder material 123 or more and is less than the glass transition temperature (TG) of the core parts of the first ball 121 and the second ball 122.

Figures 5A, 5B, 5C, 5D, 5E:
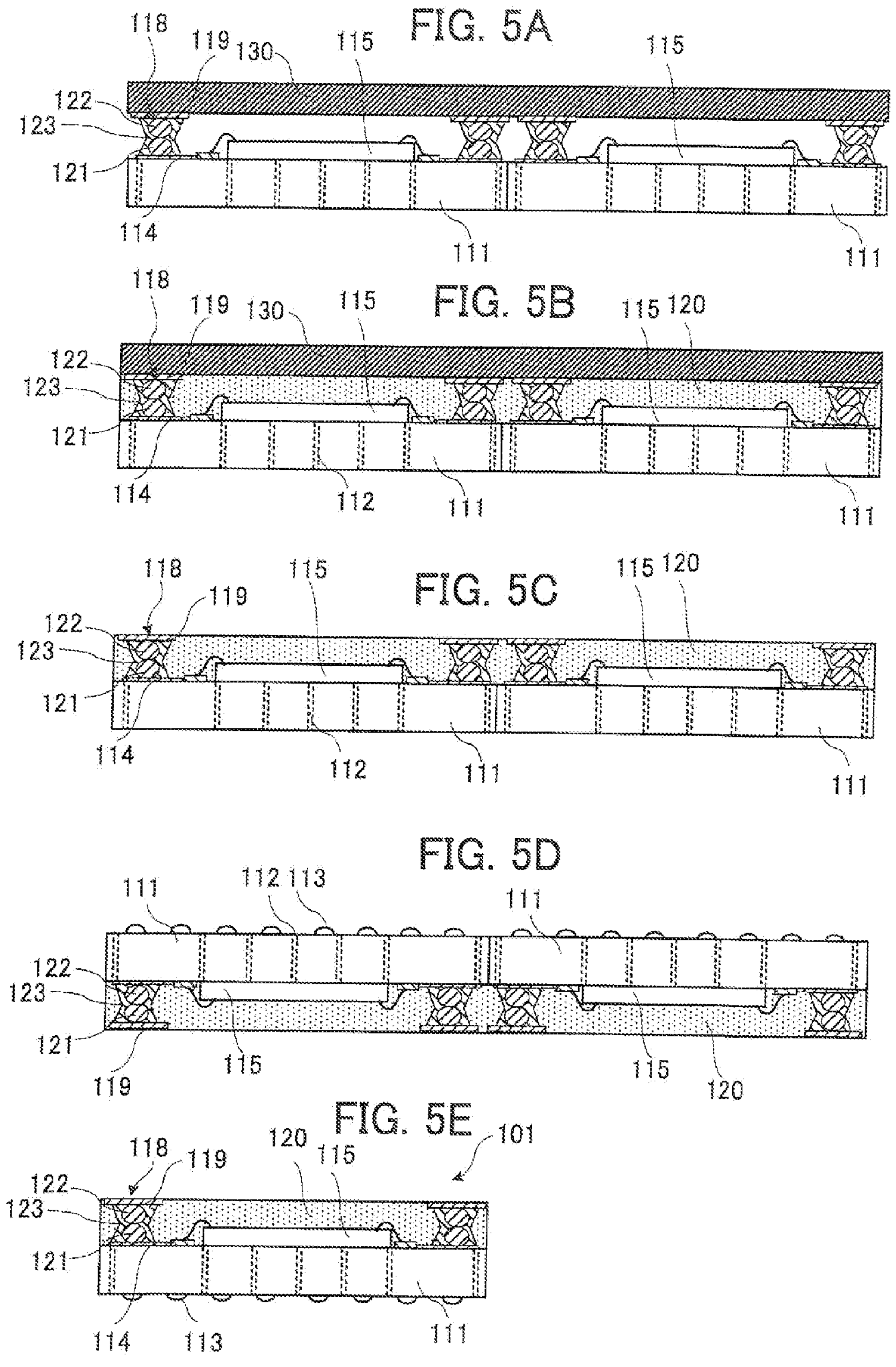
FIGS. 5A to 5E are diagrams schematically illustrating manufacturing steps in the method of manufacturing the semiconductor package according to the first embodiment.

Next, as shown in FIG. 5A, the stainless-steel plate 130 is turned upside down, the stainless-steel plate 130 is disposed above the glass-epoxy substrate 111 so that the second ball 122 is put on the first ball 121, the first ball 121 and the second ball 122 are soldered by heating which is a step of reflow soldering for example, and the flux is removed by cleaning if necessary (at ball bonding step). This reflow soldering is performed at a temperature which equals to the melting point of the solder material 123 or more and is less than the glass transition temperature (TG) of the core parts of the first ball 121 and the second ball 122. Next, as shown in FIG. 5B, the semiconductor chip 115 and the electrode unit 118 which includes the first ball 121, the second ball 122 and the solder material 123 are sealed with the mold resin 120 (at resin sealing step). Next, as shown in FIG. 5C, the stainless-steel plate 130 is removed and the POP pad 119 is exposed (at stainless-steel plate removing step). Next, as shown in FIG. 5D, the first electrode for external connection, for example, the solder terminal 113, is formed on the first surface 111*a* of the glass epoxy substrate 111 (at terminal forming step). Next, as shown in FIG. 5E, by singulating process, the semiconductor package 101 which includes the semiconductor chip is made (at singulation step). At the stainless-steel plate removing step, in order that the POP pad 119 does not separate from the electrode unit 118, it is necessary that adhesive strength between the stainless-steel plate 130 and the POP pad 119 is weaker than adhesive strength between the POP pad 119 and the electrode unit 118 and adhesive strength between the POP pad 119 and the mold resin 120. By appropriately selecting materials for the POP pad 119, the electrode unit 118 and the mold resin 120, and a manner of bonding the POP pad 119 to the stainless-steel plate 130 (e.g., to dispose another layer to be removed therebetween, or to use an adhesive agent of weak adhesive strength), it is possible that the POP pad 119 does not separate from the electrode unit 118, at the stainless-steel plate removing step.

As described above, in the semiconductor package 101 and the method of manufacturing the semiconductor package according to the first embodiment, the POP pad 119 is formed on an upper surface of the package, and therefore another package can be stacked thereon. Moreover, the electrode unit 18 includes the first ball 121, the second ball 122 which is disposed on the first ball, and the solder material by which the balls are electrically connected with the ball pad 114 and the POP pad 119, and therefore, manufacturing costs and manufacturing time can be reduced and a price of a product can be lowered.

Second Embodiment

Figure 6:
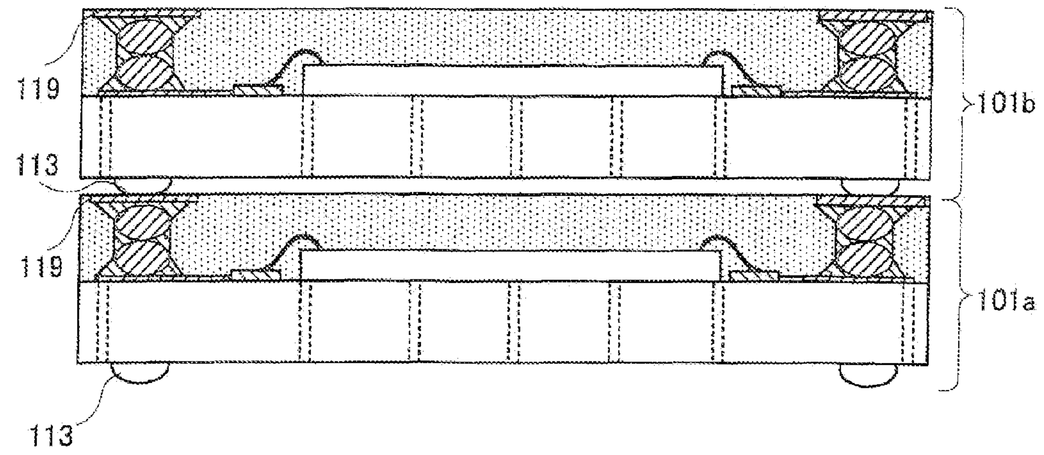
FIG. 6 is a longitudinal sectional view schematically illustrating a method of manufacturing a POP semiconductor device according to a second embodiment of the present invention.
Figure 7:
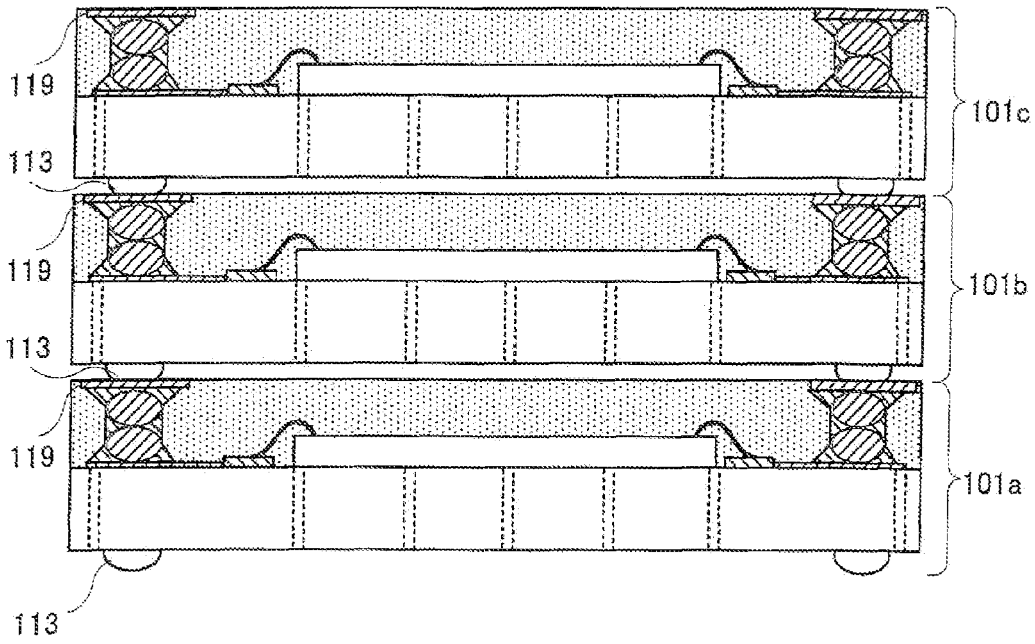
FIG. 7 is a longitudinal sectional view schematically illustrating a structure of the POP semiconductor device according to the second embodiment.

FIG. 6 is a longitudinal sectional view schematically illustrating a method of manufacturing a POP semiconductor device according to a second embodiment of the present invention, and FIG. 7 is a longitudinal sectional view schematically illustrating the POP semiconductor device according to the second embodiment. Elements in FIGS. 6 and 7 that are the same as or correspond to those in FIG. 1 are designated by the same reference numerals.

As shown in FIG. 6, in the method of manufacturing the POP semiconductor device according to the second embodiment, a first semiconductor package 101*a* is formed by the method of manufacturing the semiconductor package according to the first embodiment, a second semiconductor package 101*b* is formed by the method of manufacturing the semiconductor package according to the first embodiment, the second semiconductor package 101*b* is stacked on the first semiconductor package 101*a* so that the POP electrode 119 at the top of the first semiconductor package 101*a* contacts with the solder electrode 113 at the bottom of the second semiconductor package 101*b*, and the POP electrode and the solder electrode are solder-bonded by heating which is a step of reflow soldering, for example.

As shown in FIG. 7, a third semiconductor package 101*c* is formed by the method of manufacturing the semiconductor package according to the first embodiment, the third semiconductor package 101*c* is stacked on the second semiconductor package 101*b*, and the POP electrode and the solder electrode are solder-bonded by heating which is a step of reflow soldering, for example. Thus, through the steps described above, the POP semiconductor device according to the second embodiment is manufactured.

In the POP semiconductor device and the method of manufacturing the POP semiconductor device according to the second embodiment, a stacked structure in which a semiconductor package is stacked on another semiconductor package is adopted. Therefore, a mounting area can be reduced. Moreover, according to the second embodiment, the electrode unit 18 in the semiconductor package includes the first ball 121, the second ball 122 which is disposed on the first ball 121, and the solder 123 by which the balls are electrically connected with the ball pad 114 and the POP pad 119. Therefore, manufacturing costs and manufacturing time can be reduced and a price of a product can be lowered.

Third Embodiment

Figure 8:
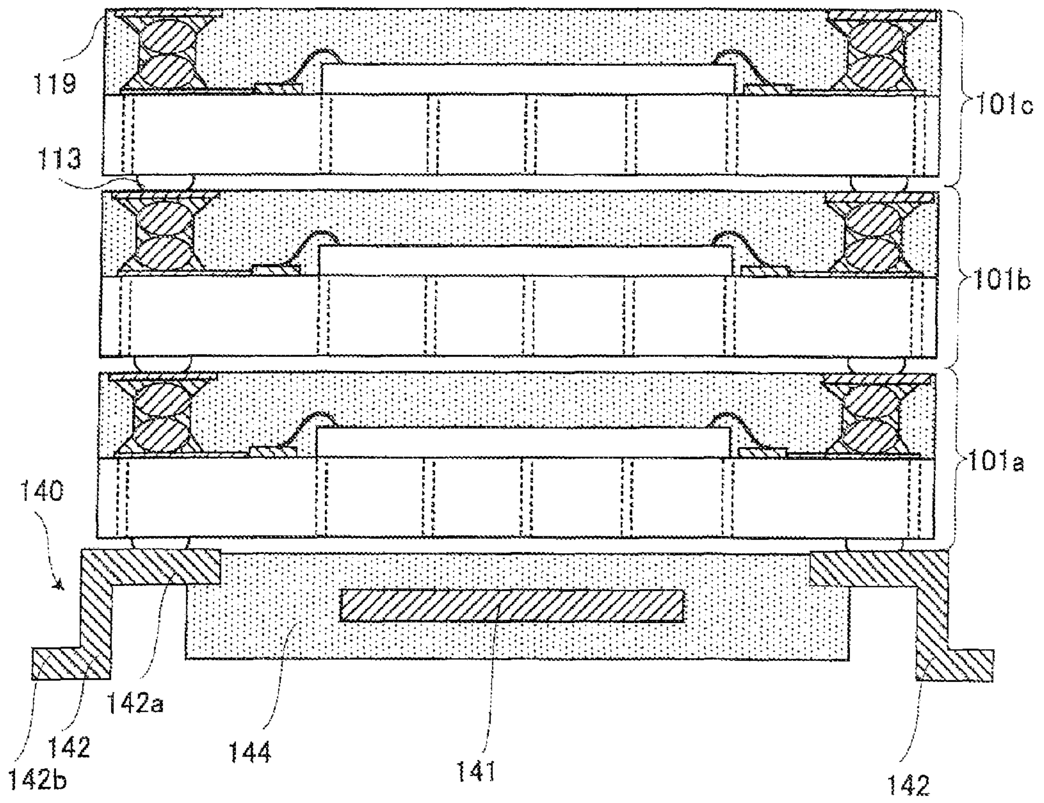
FIG. 8 is a longitudinal sectional view schematically illustrating a structure of a POP semiconductor device according to a third embodiment of the present invention.
Figure 9A:
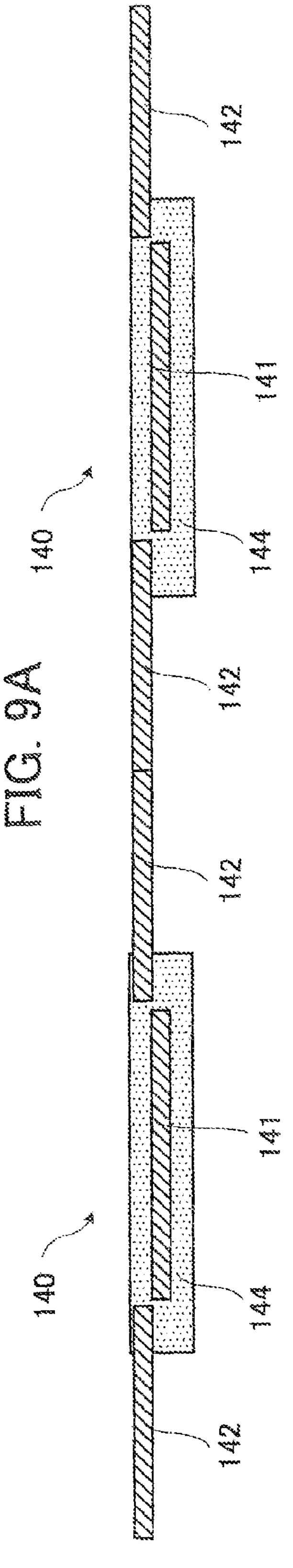
FIGS. 9A and 9B are diagrams schematically illustrating manufacturing steps in a method of manufacturing the POP semiconductor device according to the third embodiment.
Figure 9B:
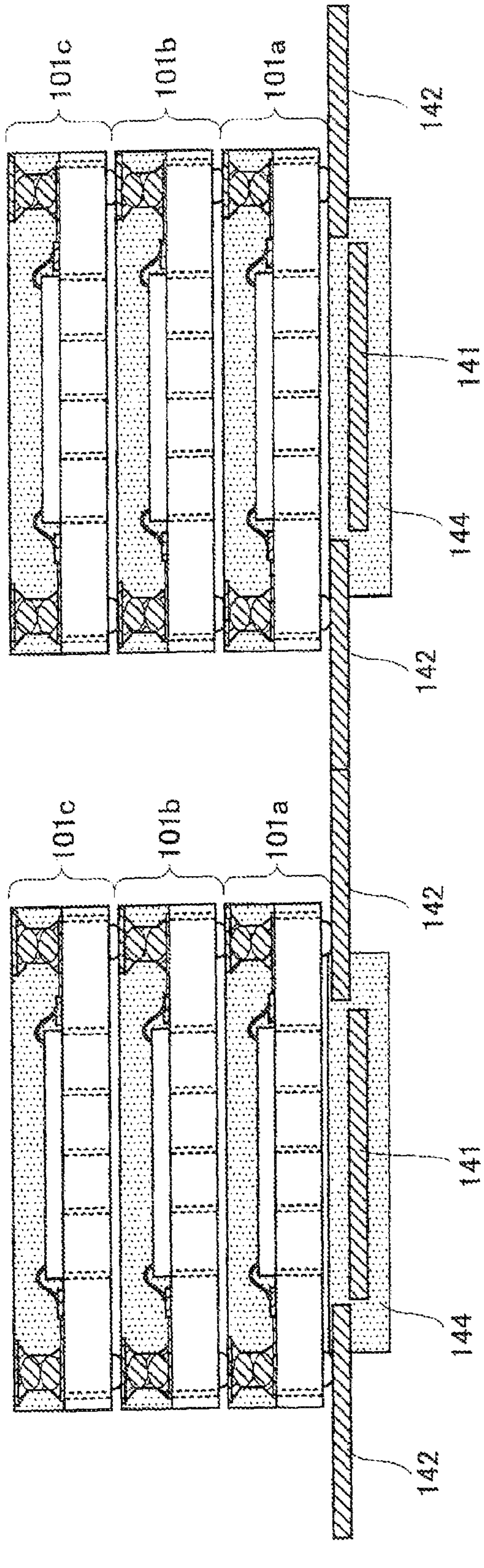
Figure 10:
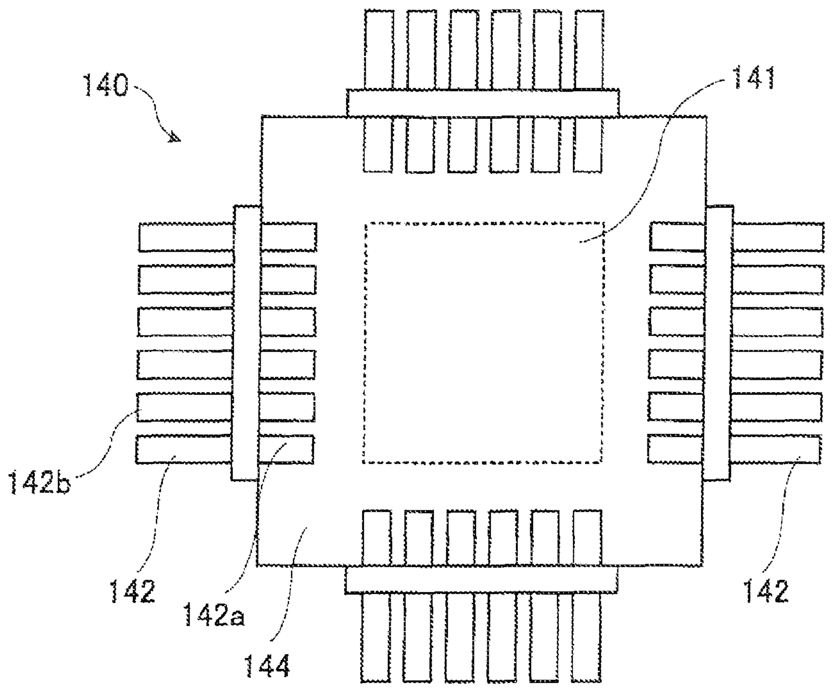
FIG. 10 is a plan view schematically illustrating a lead frame of the POP semiconductor device according to the third embodiment.

FIG. 8 is a longitudinal sectional view schematically illustrating a structure of a POP semiconductor device according to a third embodiment of the present invention, and FIGS. 9A and 9B are diagrams of manufacturing steps schematically illustrating a method of manufacturing the POP semiconductor device according to the third embodiment. FIG. 10 is a plan view schematically illustrating a lead frame of the POP semiconductor device according to the third embodiment. Elements in FIGS. 8 and 9B that are the same as or correspond to those in FIG. 7 are designated by the same reference numerals.

As shown in FIG. 8, the POP semiconductor device according to the third embodiment has a structure that the POP semiconductor device according to the second embodiment shown in FIG. 7 is joined with a lead frame 140. As shown in the drawing, the lead frame 140 includes a mold resin 144 which covers a member 141 and a lead terminal 142 which is fixed outside of the mold resin 144, for example. The solder terminal 113 of the semiconductor package 101 according to the first embodiment or of the POP semiconductor device according to the second embodiment is disposed, as shown in FIG. 9B, on an inner lead 142*a* of the lead frame 140 in FIG. 9A. After flux or solder paste is supplied thereon, the solder terminal and the lead frame are solder-bonded by heating which is a step of reflow soldering, for example. Then, the flux is removed by cleaning if necessary, an external lead 142*b* is bended and cut, and accordingly the POP semiconductor device with the lead frame as shown in FIG. 8 is completed.

In the POP semiconductor device and the method of manufacturing the POP semiconductor device according the third embodiment, a stacked structure in which a semiconductor package is stacked on another semiconductor package is adopted. Therefore, a mounting area can be reduced. Moreover, according to the third embodiment, the electrode unit 18 in the semiconductor package includes the first ball 121, the second ball 122 which is disposed on the first ball 121, and the solder material 123 by which the balls are electrically connected with the ball pad 114 and the POP pad 119. Therefore, manufacturing costs and manufacturing time can be reduced and a price of a product can be lowered. Furthermore, according to the third embodiment, a semiconductor package with a lead terminal or a POP semiconductor device with a lead terminal which satisfies a user's demand can be provided.

Fourth Embodiment

Figure 11:
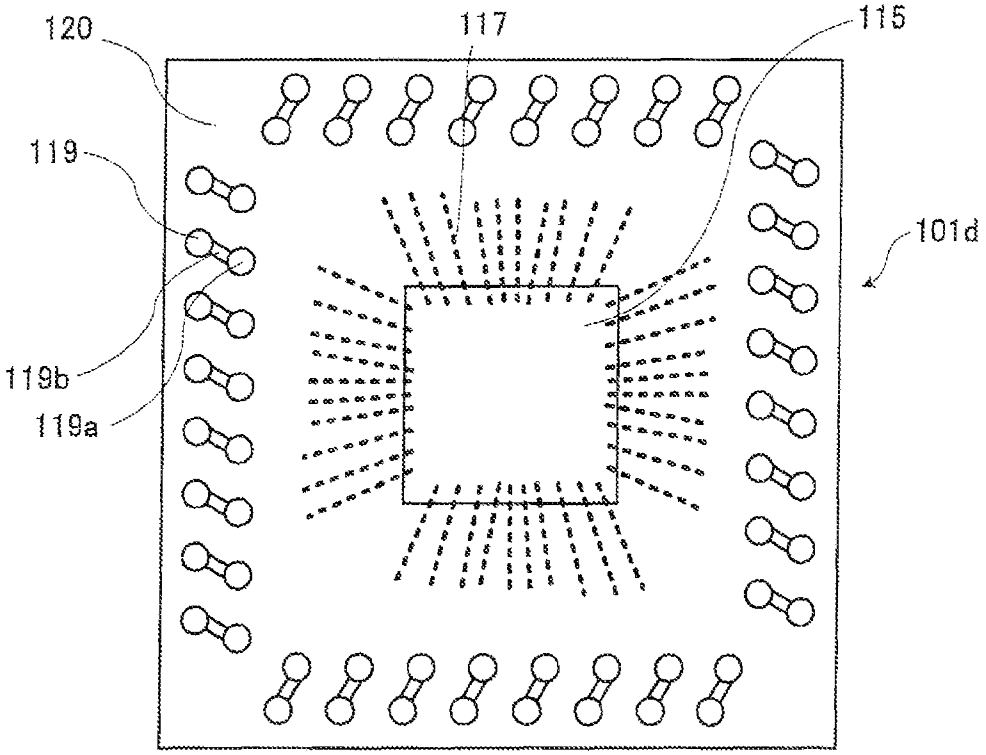
FIG. 11 is a plan view schematically illustrating a top view of a semiconductor package according to a fourth embodiment of the present invention.

FIG. 11 is a plan view schematically illustrating a top view of a semiconductor package 101*d* according to a fourth embodiment of the present invention. Elements in FIG. 11 that are the same as or correspond to those in FIG. 2 are designated by the same reference numerals. The semiconductor package 101*d* according to the fourth embodiment differs from the semiconductor package 101 according to the first embodiment in the following point that: the semiconductor package 101*d* has POP pads 119*a* which are third electrodes for external connection and are disposed on a side of an outer surface of the mold resin 120 and redistribution layers 119*b* by which the POP pad 119 and the POP pad 119*a* are electrically connected. Except for this point, the semiconductor package 101*d* according to the fourth embodiment is the same as the semiconductor package 101 according to the first embodiment.

In the method of manufacturing the semiconductor package 101*d* according to the fourth embodiment, the step of FIG. 4A for explaining the first embodiment includes forming the POP pad 119, the POP pad 119*a* and the redistribution layer 119*b* by which the POP pad 119 and the POP pad 119*a* are electrically connected, on the stainless-steel plate 130. Except for this point, the method of manufacturing the semiconductor package 101*d* according to the fourth embodiment is the same as the method of manufacturing the semiconductor package 101 according to the first embodiment.

According to the semiconductor package 101*d* and the method of manufacturing the semiconductor package according to the fourth embodiment, a semiconductor package can be stacked on another semiconductor package even if the semiconductor packages are different in size.

The semiconductor package 101*d* according to the fourth embodiment can be used as a package for the POP semiconductor device according to the second embodiment or the third embodiment.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A semiconductor package comprising:
- a wiring board including a wiring pattern and/or a through wiring;
- a first electrode for external connection disposed on a side of a first surface of the wiring board;
- a ball pad which is an electrode on a side of a second surface of the wiring board, the second surface being opposite to the first surface of the wiring board;
- a semiconductor chip mounted on the side of the second surface of the wiring board;
- a mold resin covering at least the semiconductor chip;
- an electrode unit being connected with the ball pad and penetrating the mold resin; and
- a second electrode for external connection being connected with a portion of the electrode unit on a side of an outer surface of the mold resin;
- the electrode unit including:
- a first ball disposed on the ball pad;
- a second ball disposed between the first ball and the second electrode for external connection; and
- a solder material connecting between the ball pad and the first ball, between the first ball and the second ball, and between the second ball and the second electrode for external connection;
- each of the first ball and the second ball including a core part having a glass transition temperature which is higher than a melting point of the solder material.

2. The semiconductor package according to claim 1, wherein each of the first ball and the second ball further includes a surface part covering an outer circumference of the core part.

3. The semiconductor package according to claim 2, wherein
- the core part is made of a material selected from a group consisting of metal, synthetic resin and ceramics, and
- the surface part is made of a metal material.

4. The semiconductor package according to claim 1, further comprising:
- a third electrode for external connection on the side of the outer surface of the mold resin; and
- a redistribution layer for connecting the second electrode for external connection and the third electrode for external connection.

5. The semiconductor package according to claim 1, wherein the first electrode for external connection is made of a solder material.

6. A package-on-package semiconductor device comprising:
- a first semiconductor package; and
- a second semiconductor package of claim 1 disposed on the first semiconductor package;
- wherein the first semiconductor package comprises:
- a wiring board including a wiring pattern and/or a through wiring;
- a first electrode for external connection disposed on a side of a first surface of the wiring board;
- a ball pad which is an electrode on a side of a second surface of the wiring board, the second surface being opposite to the first surface of the wiring board;
- a semiconductor chip mounted on the side of the second surface of the wiring board;
- a mold resin covering at least the semiconductor chip;
- an electrode unit being connected with the ball pad and penetrating the mold resin; and
- a second electrode for external connection being connected with a portion of the electrode unit on a side of an outer surface of the mold resin;
- the electrode unit of the first semiconductor package including:
- a first ball disposed on the ball pad;
- a second ball disposed between the first ball and the second electrode for external connection; and
- a solder material connecting between the ball pad and the first ball, between the first ball and the second ball, and between the second ball and the second electrode for external connection;
- each of the first ball and the second ball including a core part having a glass transition temperature which is higher than a melting point of the solder material;
- wherein the first electrode for external connection of the second semiconductor package is connected with the second electrode for external connection of the first semiconductor package.

7. A package-on-package semiconductor device comprising,
- a first semiconductor package; and
- a second semiconductor package of claim 1 disposed on the first semiconductor package;
- wherein the first semiconductor package comprises:
- a wiring board including a wiring pattern and/or a through wiring;
- a first electrode for external connection disposed on a side of a first surface of the wiring board;
- a ball pad which is an electrode on a side of a second surface of the wiring board, the second surface being opposite to the first surface of the wiring board;
- a semiconductor chip mounted on the side of the second surface of the wiring board;
- a mold resin covering at least the semiconductor chip;

an electrode unit being connected with the ball pad and penetrating the mold resin; and a second electrode for external connection being connected with a portion of the electrode unit on a side of an outer surface of the mold resin;

the electrode unit of the first semiconductor package including:

a first ball disposed on the ball pad;

a second ball disposed between the first ball and the second electrode for external connection; and a solder material connecting between the ball pad and the first ball, between the first ball and the second ball, and between the second ball and the second electrode for external connection;

each of the first ball and the second ball including a core part having a glass transition temperature which is higher than a melting point of the solder material;

wherein the first semiconductor package further comprises:

a third electrode for external connection on the side of the outer surface of the mold resin; and a redistribution layer for connecting the second electrode for external connection and the third electrode for external connection;

wherein the first electrode for external connection of the second semiconductor package is connected with the third electrode for external connection of the first semiconductor package.

* * * * *